United States Patent [19]

Bonis et al.

[11] 4,058,825
[45] Nov. 15, 1977

[54] COMPLEMENTARY TRANSISTOR STRUCTURE HAVING TWO EPITAXIAL LAYERS AND METHOD OF MANUFACTURING SAME

[75] Inventors: Maurice Bonis, Herouville; Bernard Roger, Carpiquet, both of France

[73] Assignee: U.S. Philips Corporation, New York, N.Y.

[21] Appl. No.: 644,065

[22] Filed: Dec. 24, 1975

[30] Foreign Application Priority Data

Jan. 10, 1975 France .................................. 75.00713

[51] Int. Cl.$^2$ ..................... H01L 27/02; H01L 27/10; H01L 29/06
[52] U.S. Cl. ......................................... 357/46; 357/44; 357/55; 357/56; 307/315
[58] Field of Search ....................... 357/44, 46, 55, 56; 307/315

[56] References Cited

U.S. PATENT DOCUMENTS

| | | | |
|---|---|---|---|
| 3,624,454 | 11/1971 | Adkinson | 357/46 |
| 3,751,726 | 8/1973 | Einthoven et al. | 357/46 |
| 3,755,722 | 8/1973 | Harland et al. | 357/46 |
| 3,836,996 | 9/1974 | Schilp et al. | 357/46 |
| 3,836,997 | 9/1974 | Einthoven et al. | 357/46 |
| 3,836,997 | 9/1974 | Schilp | 357/46 |
| 3,898,483 | 8/1975 | Sander et al. | 357/35 |
| 3,904,450 | 9/1975 | Evans | 357/46 |
| 3,959,039 | 5/1976 | Bonis et al. | 357/46 |

FOREIGN PATENT DOCUMENTS

2,403,816 8/1974 Germany .............................. 357/46

Primary Examiner—Andrew J. James
Attorney, Agent, or Firm—Frank R. Trifari; Steven R. Biren

[57] ABSTRACT

A monolithic semiconductor device comprising at least two complementary transistors, in which the base zone of a first transistor and the collector zone of a second transistor are provided in a first epitaxial layer, while the emitter zone of the second transistor, the emitter zone of the first transistor and the base zone of the second transistor are provided in a second epitaxial layer. A separation groove is provided between the transistors in the second epitaxial layer.

12 Claims, 19 Drawing Figures

COMPLEMENTARY TRANSISTOR STRUCTURE HAVING TWO EPITAXIAL LAYERS AND METHOD OF MANUFACTURING SAME

BACKGROUND OF THE INVENTION

This invention relates to a semiconductor device having a semiconductor body comprising at least two complementary transistors and consisting of a substrate of a first conductivity type which is covered with a first epitaxial layer of the second conductivity type opposite to the first, at least a part of the substrate constituting the collector zone of the first transistor; the base zone of said first transistor and the collector zone of the second transistor being constituted by adjacent parts of the said first epitaxial layer.

In numerous power amplifier circuits the output transistor is controlled by a transistor of the complementary type, for example, an npn-transistor by a pnp-transistor. A pnp-transistor may also be used for controlling an assembly of two npn transistors which is known as a Darlington amplifier. With a view to the integration of such circuits in one single device, it has been endeavoured to manufacture in the same part of the semiconductor plate at least one npn-transistor and one pnp-transistor, in which, for example, the base zone of the first transistor is connected to the collector zone of the second transistor.

It is known that there are substituted advantages associated with a structure having two integrated complementary transistors that both have an epitaxial base zone and collector zone. Known devices, in which one of the transistors has a diffused base zone actually have as drawbacks, for example, lower definition of the thickness of the base zone, an irregular doping concentration and difficulties in controlling the characteristics. The two transistors of these devices are different and the variation of the characteristics with temperature disturbs the operation considerably. The output transistor, which usually is a power transistor, is difficult to manufacture by diffusion operations. In addition, planar transistors having a diffused base are relatively more sensitive to the occurrence of second breakdown than are transistors having an epitaxial base.

In French patent application No. 7,303,748 published under No. 2,216,678 and filed on Feb. 2, 1973, applicants describe a structure of which the two transistors have an epitaxial base zone and collector zone which yields a great number of advantages. However, this structure also suffers from drawbacks, both in itself, and in the methods which are necessary to obtain said structure.

In the preferred embodiment of applicants' earlier structure (in which the two transistors adjoin the same surface) an epitaxial layer of a first conductivity type has to be etched away, and epitaxial layer of the opposite conductivity type has then to be grown in the resulting aperture and constitutes the base zone of one of the two transistors, in which base zone the emitter zone of the same transistor is then diffused. Hence it is difficult, on the one hand, to obtain by etching a window of a uniform depth and a correct surface state (whence a poor definition of the thickness of the base zone and nonuniformities in the basecollector junction), and on the other hand it is also difficult to form a local epitaxial layer.

In the second embodiment of the applicants' earlier structure (in which one of the transistors is at an elevation relative to the other one) a part of an epitaxial layer has also to be removed so as to reach a deeper layer and to manufacture in the surface of said deeper layer the emitter zone of one of the two transistors. Since the etching runs off irregularly, the deep layer is more or less subject to initial etching and the surface thereof is very nonuniform; consequently, the emitter zone which is diffused at this surface has a poorly defined depth and the underlying emitterbase junction has a capricious profile. As regards the structure itself, it is known in addition that when the profile of the active surface of a semiconductor structure shows unevennesses, drawbacks result therefrom, as for example, the difficulty of performing accurate photo-etching treatments and in particular a possibility of cracking of the insulating and conducting layers which are provided on the unevennesses.

SUMMARY OF THE INVENTION

It is therefore an object of the invention to avoid the above-mentioned drawbacks of known semiconductor structures having at least two complementary transistors with epitaxial base structures.

Another object of the invention is to improve the gain of such devices.

The invention uses the differences in depth of emitter zones and base zones between complementary transistors. The invention also takes into account recently made observations regarding the improvement of the efficiency of the injection of minority charge carriers from the emitter zone to the base zone of a transistor when said emitter zone is sufficiently weakly doped in the vicinity of the base zone and is highly doped at its surface levels.

According to the invention, a semiconductor device of the kind mentioned in the preamble is characterized in that the emitter zone of the first transistor and the base zone of the second transistor are formed by parts of a second epitaxial layer of the first conductivity type provided on the first epitaxial layer, such parts being separated from each other by at least one groove having such a depth as to cut the second epitaxial layer entirely and to cut the first epitaxial layer only partially, the emitter zone of the second transistor being provided in that part of the second epitaxial layer constituting the base zone of said second transistor.

When such a structure is used as a power amplifier, the first transistor is the output transistor of the assembly and the second transistor is the input transistor.

The structure according to the invention presents many advantages as compared with analogous known structures.

First of all, the gain of the amplifier circuit can be increased with this structure; in particular the gain of the power transistor may be increased due to the fact that the emitter zone of said transistor is epitaxial.

It is known that the current gain of a transistor depends on the ratio between the respective coefficients of injection of minority charge carriers from the emitter to the base on the one hand and from the base to the emitter on the other hand; this amplification is larger as the minority current emitter-base exceeds the minority current base-emitter. In the known structure of a transistor having a diffused emitter zone the doping concentration in the emitter zone is very high in the vicinity of the emitter-base junction; as a result of this the profile of the electric field is such that it favors the injection of minority carriers from the base to the emitter and hence counteracts the gain of the transistor.

In manufacturing the emitter zone by epitaxy, on the one hand the level of the doping concentration in the emitter in the vicinity of the emitter-base junction of the transistor can be controlled at a desired value which is lower than that which is inevitably achieved by the diffusion process and hence the life of the minority carriers of the emitter can be increased. On the other hand, a layer having a high doping concentration of the same type may be provided (for example by diffusion or ion implantation) in the surface levels of the epitaxial layer remote from the emitter-base junction, in which layer the minority carriers which have been injected from the base meet a strongly repellent field. These measures favor the injection of minority carriers in the emitter-base direction relative to the injection in the opposite direction and hence cooperate in the improvement of the gain of the transistor.

Furthermore, the structure according to the invention is advantageous due to the smoothness of its active surface. The ohmic connections between the various elements of the structure (which may comprise in addition resistors or other integrated passive parts) are thus obtained more easily and in a reproducible manner.

Moreover, all the advantages associated with analogous known structures as described in the abovementioned application of applicants are maintained. The two transistors of the device have an epitaxial base zone and both of them have less tendency toward second breakdown than a planar double-diffused transistor; they both show the advantages resulting from a better definition of the thickness of the base and from a homogeneity of the doping concentration in the base zone so that better control of the characteristics is obtained. Since the base zone of the first transistor and the collector zone of the second transistor are present beside each other, an excellent electric and thermal connection is obtained.

In addition, in manufacturing the structure according to the invention the advantage is obtained that all masking and photoetching treatments which result in the manufacture of the assembly of two transistors are carried out from flat surfaces, as will become apparent from the description hereinafter. Accordingly the places of the various regions of the structures are readily bounded.

In addition, none of the epitaxial deposits is localized in a given region of the structure, so that one need not use maskings, which in epitaxial methods are always difficult, or etching methods in which the etching depth is to be observed strictly and which in all circumstances have an unfavorable influence on the surface structure of the relevant regions.

In an advantageous embodiment of the structure according to the invention, the substrate on which the first epitaxial layer is present comprises a surface layer having a comparatively small thickness and a lower doping that the bulk of the substrate. With the lower doped surface layer the breakdown voltage of the base-collector junction of the first transistor can be higher then in the absence thereof; when in fact the junction is at a potential, the depletion zone can extend further into the substrate, which serves as a collector. In addition, the lower doped surface layer avoids an undesired out-diffusion of the doping impurities from the substrate to the first epitaxial layer during the deposition of the latter.

It is also advantageous to provide a buried layer in the part of the first epitaxial layer which forms the collector zone of the second transistor, such buried layer being provided at a distance from the substrate and from the base zone of the second transistor and being more highly doped than the part of the first epitaxial layer surrounding the buried layer. The object of the buried layer is to reduce the gain of the stray transistor which is formed by the base zone and the collector zone of the second transistor on the one hand and the substrate on the other hand and thus to prevent a thyristor effect from occurring; the buried layer also cooperates in reducing the resistance of the connection between the base zone of the first transistor and the collector zone of the second transistor.

It is also advantageous for the base zone of the second transistor to comprise two layers, one surface layer of which is more highly doped than the underlying layer. The more highly doped surface layer prevents the risk of an inversion layer at the surface of the base region. When the surface layer is made thicker than the emitter zone of the same transistor, it can be prevented that, when the base-collector junction of said transistor is polarized in the reverse direction, the depletion zone surrounding the junction extends so as to reach the emitter zone.

In itself the structure according to the invention constitutes an amplifier circuit of the Darlington type. This structure can be incorporated in more complicated circuits comprising at least a third transistor of the same structure as one of the complementary transistors. A circuit capable of fulfilling the role of audio-frequency amplifier is constituted by a first transistor, for example an npn transistor, a second transistor of the pnp-type — the two transistors constituting a structure according to the invention — and a third npn-transistor of the same structure as the first transistor. The emitter zones and the base zones of the first and the third transistor are insulated from each other by a groove which is provided from the surface of the device and the depth of which reaches down to the underlying substrate. The substrate forms a collector which is common to the first and the third transistor; as a result of this, the two transistors are intimately thermally connected.

The structure according to the invention may be incorporate in a more complicated combination consisting of a push-pull assembly comprising two complementary Darlington circuits. A first circuit is constituted by a transistor, for example a pnp-transistor (second transistor of the device according to the invention) and an npn-transistor (output transistor or first transistor of the device according to the invention); a second circuit is constituted by two npn-transistors having an epitaxial base zone, each of the said transistors having a structure greatly resembling the structure of the npn of the first circuit (the difference being that contact is made to the base).

It is known that the pushpull assembly according to such a diagram presents the advantage relative to an assembly having an npn/pnp-Darlington circuit and a pnp/pnp-Darlington circuit, that a larger voltage variation is permissible by a weaker output voltage.

The present invention also relates to a method of manufacturing the semiconductor device described.

The invention will now be described in greater detail with reference to the accompanying drawings.

In most figures the oxide layers are not shown. It is also noted that the dimensions of the devices are not drawn to scale for reasons of clarity, in which in particular the thickness dimensions are actually much smaller with respect to the dimensions at the surface.

DETAILED DESCRIPTION

Figure 1:
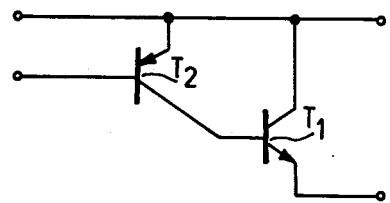
FIG. 1 shows a diagram of a semiconductor device according to the invention which serves as a Darlington amplifier.
Figure 2:
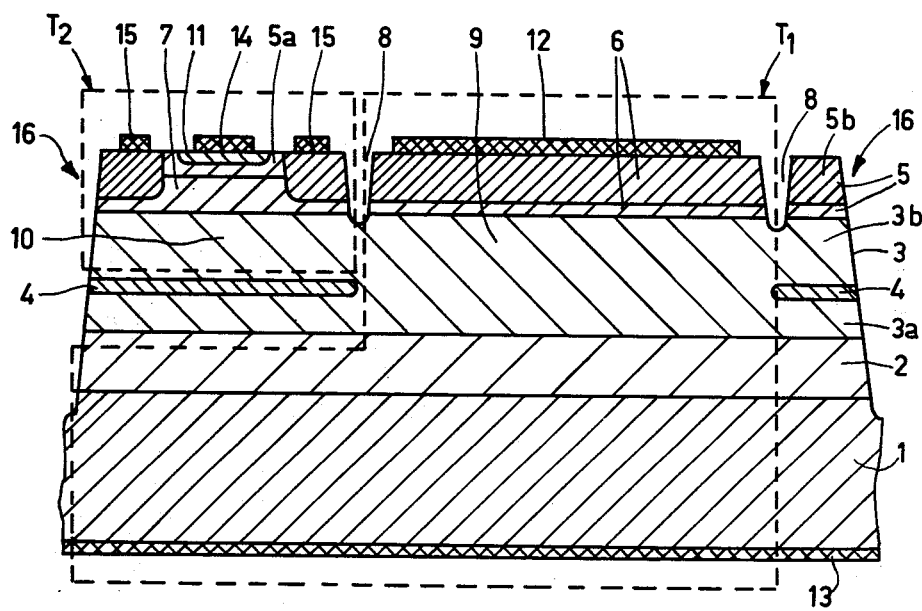
FIG. 2 is a sectional view taken on the line AA of FIG. 3 of a device according to the invention according to the diagram shown in FIG. 1.
Figure 3:
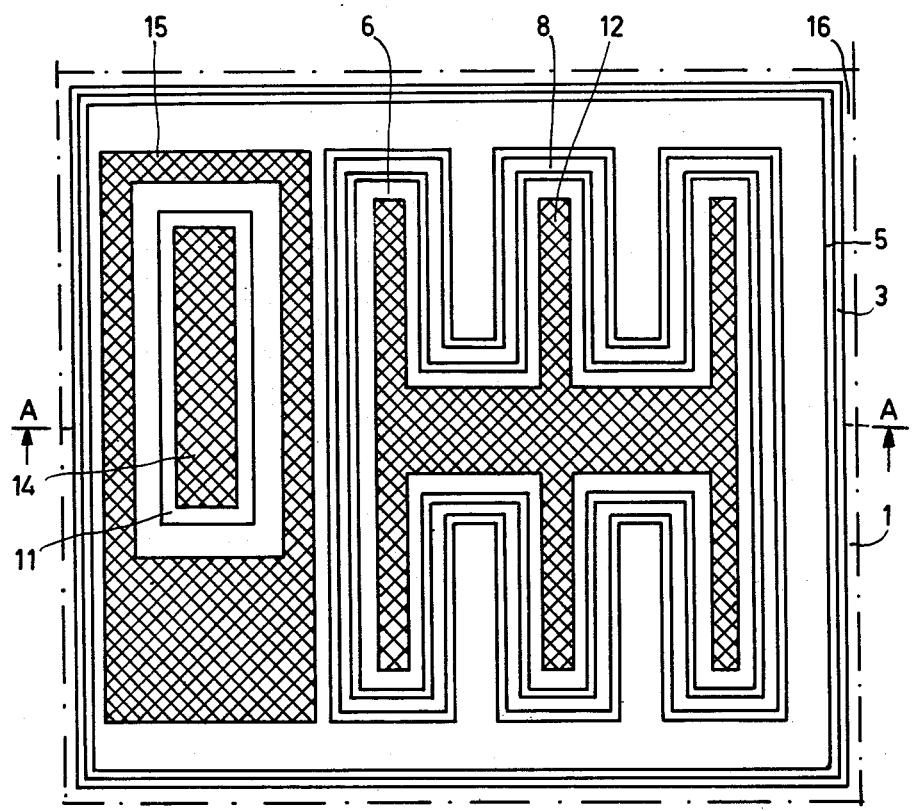
FIG. 3 is a plan view of a circuit of two transistors according to the diagram of FIG. 1.

The semiconductor device shown in FIGS. 2 and 3 comprises two transistors $T_1$ and $T_2$ which correspond to the two elements of the Darlington amplifier shown in FIG. 1. The transistor $T_1$ has an emitter zone 6, a base zone 9 and a collector zone (1, 2). The transistor $T_2$ has an emitter zone 11, a base zone (7) and a collector zone 10. The device is manufactured on a semiconductor substrate 1, for example of the $n+$ conductivity type, the + sign denoting that the doping impurity concentration is comparatively high. An epitaxial surface layer 2 of the n-conductivity type covers the substrate 1 and said layer has an impurity concentration which is lower than that of the substrate. A first epitaxial layer 3 of the p-type covers the layer 2. Provided in the epitaxial layer 3 is a buried layer 4 of the $p+$ type which is present beyond the zone which is located it the transistor $T_1$. The epitaxial layer 3 is covered by a second epitaxial layer 5 of the n-type. Said epitaxial layer 5 comprises a surface layer which is constituted by a first region 5a of the $n+$ conductivity type which is present below the emitter zone 11 of the transistor $T_2$ and projects slightly beyond the boundaries of the surface of the said emitter zone 11, and by a second region 5b which is more highly doped and deeper than the region 5a and which extends at the surface of the remaining part of the said layer 5. Said two regions 5a and 5b have been obtained, for example, by two diffusions.

According to the invention the emitter zone 6 of the first transistor and the base zone 7 of the second transistor are formed by parts of the second epitaxial layer 5, the parts being separated from each other by a groove 8 which is so deep that it cuts the said second epitaxial layer 5 entirely and cuts the first epitaxial layer 3 only partially.

The base zone 9 of the first transistor $T_1$ is constituted by a part of the first epitaxial layer 3 and the collector zone is present in the substrate 1 covered by the layer 2; the collector zone 10 of the second transistor $T_2$ is constituted by another part of the first epitaxial layer 3, which parts of the said layer 3 are adjoining, and the emitter zone 11 is diffused in the surface zone 5a of the epitaxial layer 5. Contacts are made by means of metal layers, on the one hand at 12 on the emitter zone 6 and at 13 on the collector zone 1 of $T_1$, on the other hand at 14 on the emitter zone 11 and at 15 on the base zone 7 of $T_2$.

It will be obvious that the surfaces of the device which are not covered by a metal contact are covered with an oxide skin which ensures insulation and passivation.

Each of the transistors $T_1$ and $T_2$ has the so-called "mesa" shape, which mesas are determined on the one hand by the separation groove 8, and on the other hand by the deep groove 16 which surrounds the assembly of the device and extends at least down to the layer 2. As already noted, the surface elements of the structure are strictly coplanar.

It is also noted that the emitter zone 6 of the transistor $T_1$ is less doped in its deep layers (epitaxial layer 5) near its emitter-base junction than at its surface (diffused surface layer 5b), so that the amplification is increased.

The buried layer 4 having a strong doping degree restricts the amplification of the stray transistor formed by the epitaxial layer 5 (emitter), the epitaxial layer 3 (base), the substrate 1, and the layer 2 (collector).

On the other hand, said layer 4 surrounds the base zone 9 of the transistor $T_1$ entirely and thus contributes to the decrease of the resistance of the connection between the said base zone 9 and the collector zone 10 of the transistor $T_2$.

Figure 4:
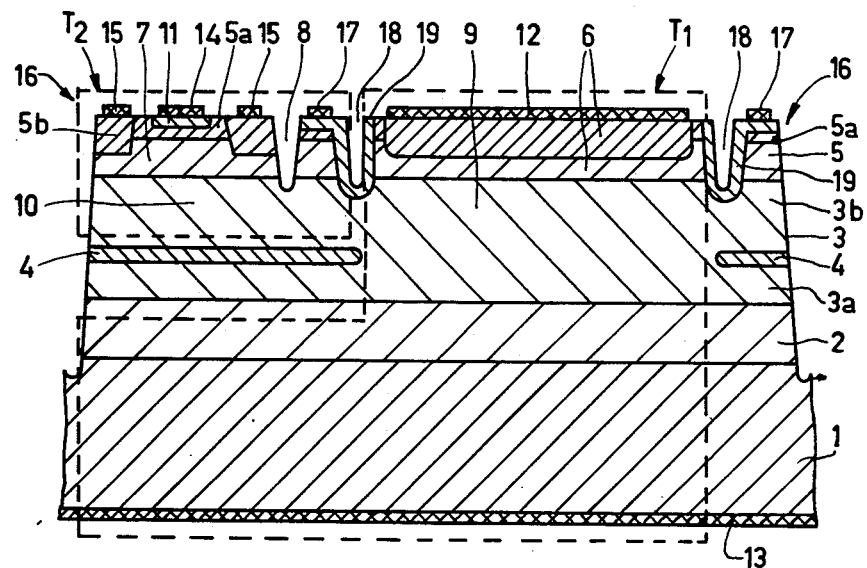
FIG. 4 shows a semiconductor device according to the invention which resembles that of FIG. 1 but which comprises in addition a contact on the base of the first transistor (and also on the collector of the second transistor). The sectional view of FIG. 4 is taken on the line BB of FIG. 5, which is a plan view of the same structure.
Figure 5:
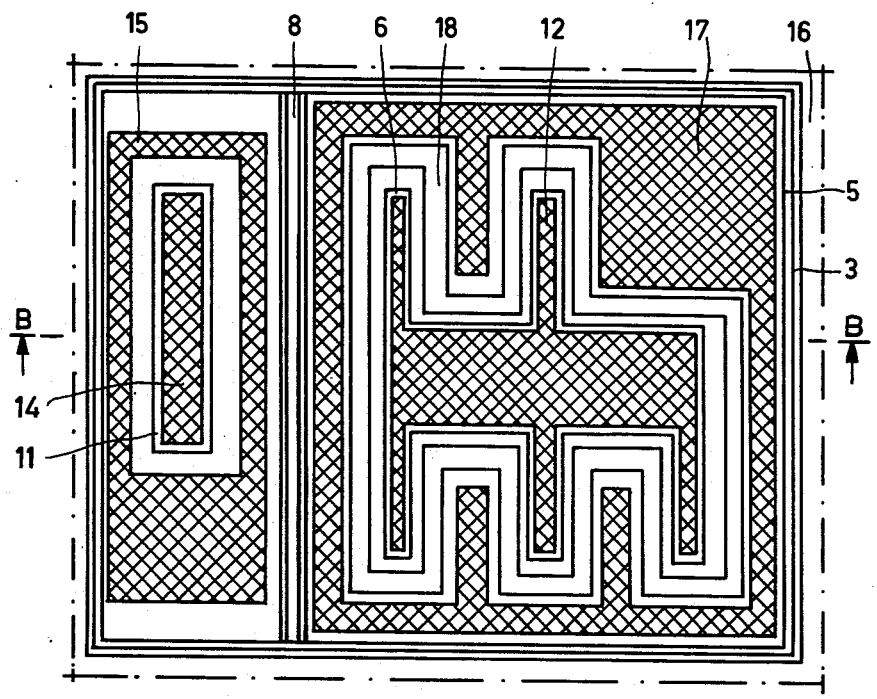

A structure which much resembles the structure just described is present in the device shown in FIGS. 4 and 5 (in which for elements of FIGS. 4 and 5 which correspond to those of FIGS. 2 and 3 the same reference numerals are used). This structure differs essentially from the first structure by the presence of a contact 17 which is provided on the base zone 9 of the transistor $T_1$; in order to obtain this, a groove 18 is provided the depth of which is substantially the same as that of groove 8 and which surrounds the emitter zone 6 entirely, in which groove 18, as well as on the surface of the structure at the edge of the said groove 18, a contact zone 19 is diffused of a suitable conductivity type (for example p+ type if the epitaxial layer 3 in which the base zone 9 of the transistor $T_1$ is present is itself of the p-type).

It should also be noted that the emitter zone 6 of the transistor $T_1$ is localized here while in FIGS. 2 and 3 it extended up to the edge of the groove 8; such an arrangement might equally well be used in the device shown in FIGS. 2 and 3.

Figure 6:
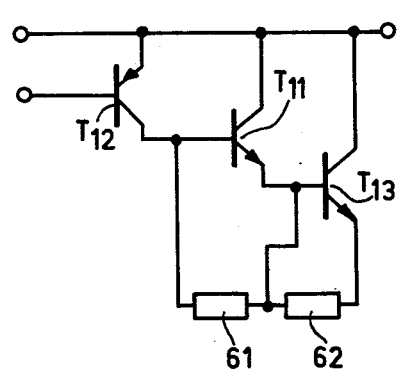
FIG. 6 shows a diagram of an amplifier having three transistors comprising a Darlington structure of the type shown in FIG. 1.
Figure 7:
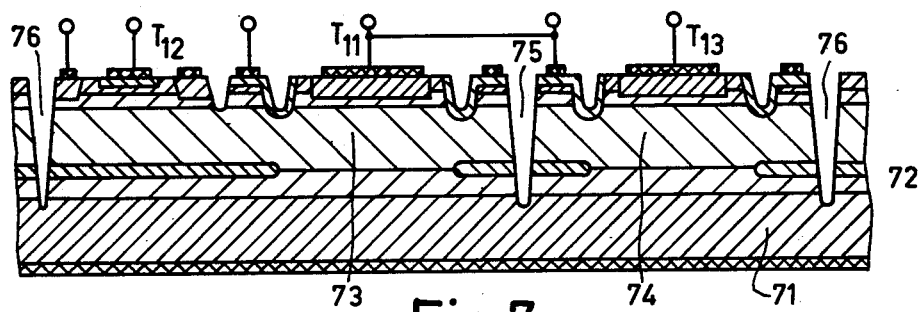
FIG. 7 is a sectional view of a monolithic integrated circuit of three transistors manufactured according to the diagram of FIG. 6.

The structure shown in FIGS. 4 and 5 is interesting in that sense that therewith the application limits of the device according to the invention can be expanded beyond those of the simple use of Darlington amplifiers. Said structure is present, for example, in the monolithic circuit having three transistors $T_{11}$, $T_{12}$ and $T_{13}$ of FIG. 7 which corresponds to the circuit diagram of FIG. 6.

The two transistors $T_{12}$ and $T_{11}$ constitute a pnp/npn Darlington circuit which is identical to that of FIGS. 4 and 5; the two transistors $T_{11}$ and $T_{13}$ of the same composition and if desired approximately the same dimensions constitute an npn/npn Darlington circuit. The transistors $T_{11}$ and $T_{13}$ have a common collector zone which is constituted by the substrate 71 which has a surface layer 72 of low doping. The base zones 73 and 74 of the transistors $T_{11}$ and $T_{13}$ are insulated from each other by a groove 75. A groove 76 insulates the circuit from other structures possibly manufactured on the same substrate 71. It is to be noted that during the manufacture of such a circuit the resistors 61 and 62 (FIG. 6) can easily be integrated in the structure. The electric connection between the emitter zone of the transistor $T_{11}$ and the base zone of the transistor $T_{13}$ is then provided in known manner on a resistance track which consists of semiconductor material and constitutes the resistor 61. In the case in which the resistor 61 is integrated, it is no longer necessary to provide an output for the base zone of the transistor $T_{11}$. As a result of this, in FIG. 7, instead of the pair $T_{11}$-$T_{12}$ according to the structure of FIG. 4 (for example with base output of $T_{11}$), a pair according to the structure of FIG. 2 (without a base output for $T_{11}$) may be provided. If the resistor 62 is integrated it is not necessary either to provide a base output of the transistor $T_{13}$ and the said transistor $T_{13}$ may be provided analogously to the transistor $T_{11}$ without a base output.

Figure 8:
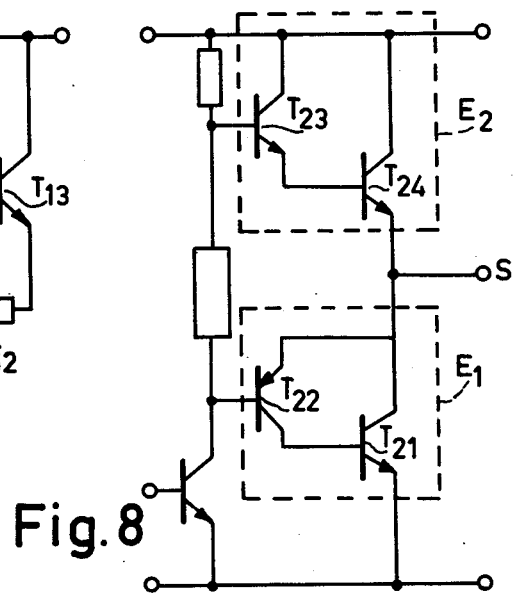
FIG. 8 shows a push-pull amplifier circuit having a Darlington structure of which the diagram is shown in FIG. 1.
Figure 9:
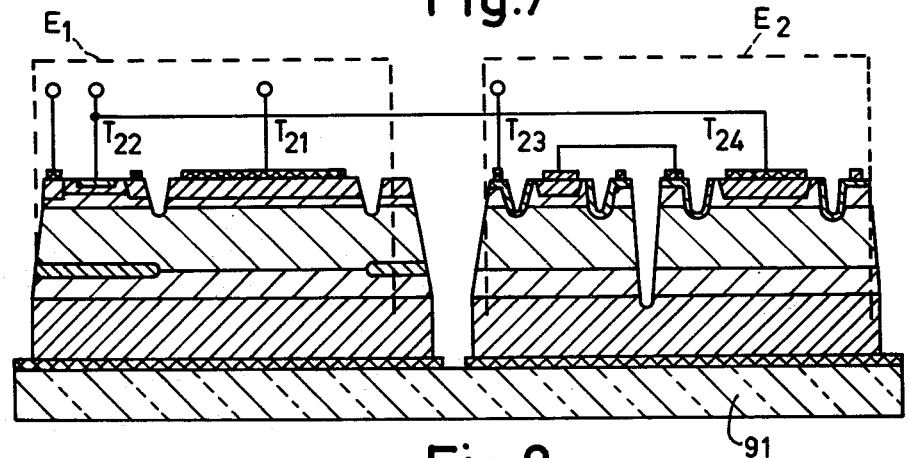
FIG. 9 is a sectional view of a circuit of four transistors according to the device shown diagrammatically in FIG. 8.

The pushpull circuit shown in FIG. 9 in agreement with the diagram of FIG. 8 comprises with the transistors $T_{21}$ and $T_{22}$ a pnp/npn-Darlington amplifier the structure of which is shown in FIGS. 2 and 3 (sub-circuit $E_1$) and which is coupled to another npn-Darlington amplifier (sub-circuit $E_2$) comprising two of the same transistors as the output transistor $T_1$ of FIG. 4. The two sub-circuits $E_1$ and $E_2$ are provided on the same insulating support 91 so as to be provided in an envelope which may protect possible other elements.

The principal steps of a method of manufacturing a device according to the invention will now be described with reference to FIGS. 10a to 10j. The manufacture of a Darlington circuit according to the diagram of FIG. 1 and the diagrammatic sectional view of FIG. 2 has been chosen by way of example.

Figure 10A:
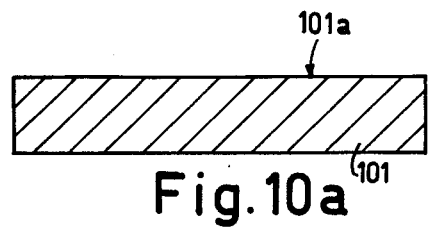
FIGS. 10a to 10j show several stages in the manufacture of the device shown in FIGS. 1 and 2.

Starting material is a wafer 101 of silcion, for example of the $n+$ type, having a thickness of 300 $\mu$m and doped with antimony and having a resistivity of 0.01 Ohm.cm (FIG. 10a).

Figure 10B:
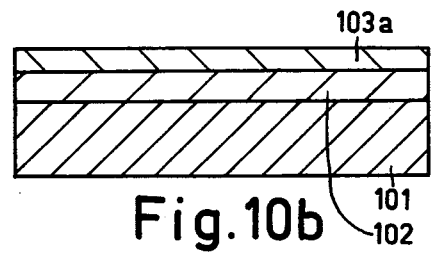

On a suitably prepared surface 101a of said wafer an epitaxial layer 102 of the n-type is deposited which is doped with phosphorus and has a thickness of 10 /$\mu$m and a resistivity of 3 Ohm.cm, after which the first part 103a of an epitaxial layer 103 (which was termed before "first epitaxial layer") of the p-type is provided which is doped with boron and has a thickness of 8 $\mu$m and a resistivity of 7 ohm.cm (FIG. 10b).

Figure 10C:
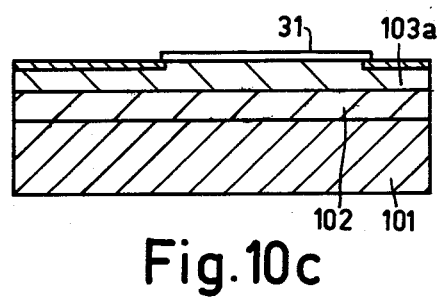
Figure 10D:
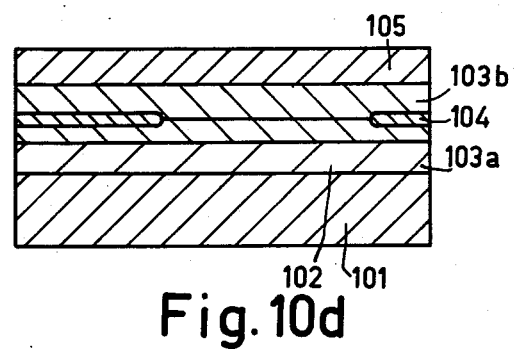

A local boron diffusion is then carried out in the part 103a of the layer 103 to form the buried layer 104 which is present below the transistor $T_2$ to be manufactured. The layer 31 is the diffusion mask of silicon oxide or silicon nitride (FIG. 10c).

The epitaxial layer 103 is then completed by growing the part 103b having a thickness of 12 $\mu$m and the same physical characteristics as the preceding part 103a. During said growth, the boron diffused during previous operations diffuses further and the layer 104 gradually takes its definite dimensions. The said $p+$ doped layer 104 has a low resistance of the order of 0.1 ohm.cm. A second n-type epitaxial layer 105 which is doped with phosphorus and has a thickness of 9 $\mu$m and a resistivity of 3 to 4 ohm.cm (FIG. 10d) is then provided on the epitaxial layer 103.

Figure 10E:
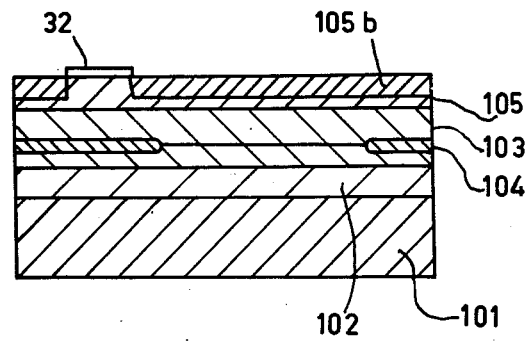

A phosphorus diffusion giving the $n+$ conductivity type is carried out locally on the layer 105 (the oxide mask 32 restricts the diffusion to the base contact zone of the transistor $T_2$ to be manufactured and to the upper layer of the emitter zone of the transistor $T_1$ to be manufactured), down to a depth of 5 to 7 $\mu$m in such manner that at said depth a layer having a low surface resistance of the order of a few Ohm per square is obtained. Said diffusion determines the surface layer 105b in the layer 105 (FIG. 10e).

Figure 10F:
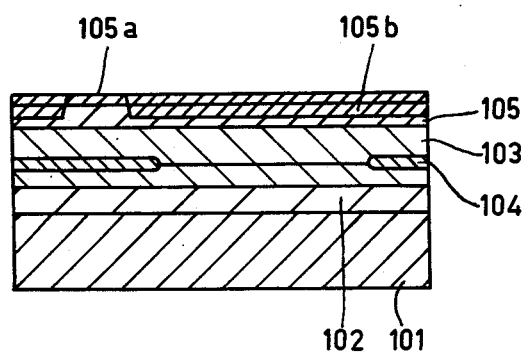

The above-mentioned diffusion is succeeded by a nonlocalized phosphorous diffusion which gives the $n+$ conductivity type in the surface zone which was previously protected by the mask 32. Said phosphorus diffusion is continued until a surface layer 105a is obtained having a depth of 3.5 $\mu$m the surface resistance of which lies between 100 and 200 Ohm per square (FIG. 10f).

In FIGS. 10f to 10j the surface layer 105a is shown in the surface layer 105b so as to better distinguish said two layers and their respective thicknesses. However, it will be obvious that, since the layer 105b is more highly doped than the layer 105a, the latter disappears at the edge of the said layer 105b as is shown in FIGS. 2 and 4 (corresponding layers 5a and 5b).

Figure 10G:
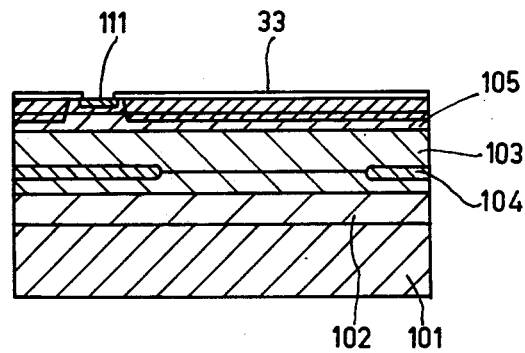

The emitter zone 111 of transistor $T_2$ is then formed by a $p+$ diffusion which is determined by the oxide mask 33 in the surface layer 105a of the layer 105. Said diffusion, which is obtained starting from boron, reaches a depth of 2.5 $\mu$m and is carried out so that the region of the emitter zone 111 is given a surface resistance of 10 to 15 Ohm/square (FIG. 10g).

Figure 10H:
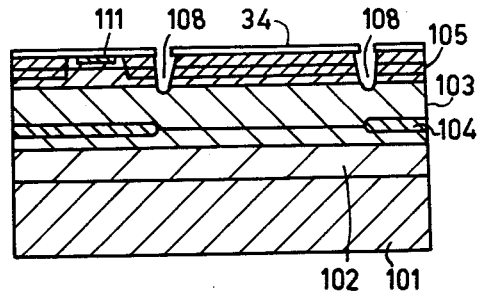

The groove 108 is then etched, the structure being protected in addition by the mask 34 of a photosensitive lacquer; the depth of the groove is between 11 and 12 $\mu$m (FIG. 10h).

Figure 10I:
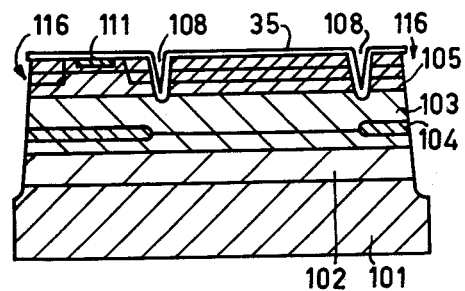

The groove 116 is then etched, the upper surface of the structure being protected entirely by the mask 35 of photosensitive lacquer; the groove 116 reaches a depth between 40 and 45 $\mu$m (FIG. 10i).

In this stage of the manufacture the wafer, at least at its active surfaces, is covered with a passivating layer of silicon oxide. Said layer which is referenced 36 in FIG. 10j has a thickness of 1 to 3 $\mu$m.

Figure 10J:
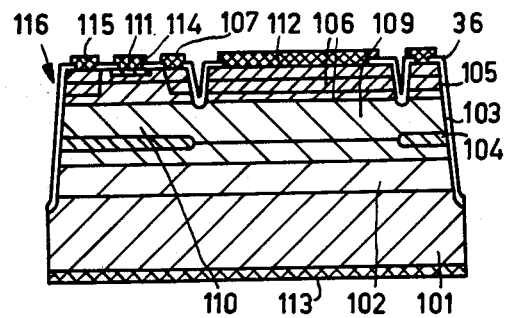

Contact windows are still to be opened on the emitter zone 106 of transistor $T_1$, on the emitter zone 111 and on the contact region of the base zone 107 of transistor $T_2$, and, by vapor depositing and etching of, for example, aluminium (layer having a thickness of 3 $\mu$m) the contacts 112 are to be formed on the emitter zone 106, 114 on the emitter zone 111 and 115 on the contact region of the base zone 107. The oppositely located surface of the device may be provided with a metallization 113 for contacting the substrate 101 (FIG. 10j).

Afterwards, during the assembly of the structure in its protective envelope, the emitter zone 111 of transistor $T_2$ is connected to the collector zone 101 of transistor $T_1$.

The manufacture of the device shown in FIGS. 4 and 5 comprises a small but important modification of the method described which is imposed by the necessity of simultaneously manufacturing the emitter zone 11 of transistor $T_2$ and the contact region 19 in the base zone 9 of transistor $T_1$ (see FIG. 4) which have the same conductivity type.

Immediately after providing the surface layer 5a, the groove 8 and the groove 18 are also provided simultaneously; the structure is then masked, with the exception of the emitter zone 11, the groove 18 and the metallization side of the contact 17; the $p+$ layer is then diffused which leads to the formation of the said emitter zone 11 and the contact zone 19; the deep groove 16 is then provided; subsequently a passivating layer is provided and the contact metallizations 6 described above are formed.

It is to be noted that it is possible to manufacture simultaneously the structure shown in FIG. 2 and the structure shown in FIG. 4.

It should also be noted that the structure according to the invention and the devices involved cannot only be realized starting from a base circuit comprising an output transistor $T_1$ of the npn-type and a transistor $T_2$ to the pnp-type. In fact it is readily possible without altering the above-mentioned method to manufacture a circuit in which $T_1$ is of the pnp-type and $T_2$ is of the npn-type.

What is claimed is:

1. A semiconductor device having a substantially planar semiconductor body including at least first and second complementary transistors each having emitter, base and collector zones and comprising a substrate of a first conductivity type which is covered with a first epitaxial layer of a second conductivity type opposite to that of the first, at least a part of said substrate comprising the collector zone of the first transistor, the base zone of said first transistor and the collector zone of the second complementary transistor comprising adjacent, electrically connected parts of said first epitaxial layer, and a second epitaxial layer of said first conductivity type provided on the first epitaxial layer and the emitter zone of the first transistor and the base zone of the second transistor comprise portions of said second epitaxial layer, said portions of the second epitaxial layer being separated from each other by at least one groove having a sufficient depth to extend through said second epitaxial layer entirely and to extend only partially into said first epitaxial layer, and an emitter zone of said second transistor formed in that part of said second epitaxial layer constituting the base zone of said second transistor, and means for providing circuit connections to zones of the first and second transistors.

2. A semiconductor device as claimed in claim 1, wherein said second epitaxial layer comprises a surface layer portion which is more highly doped than its underlying portion which adjoins the first epitaxial layer.

3. A semiconductor device as in claim 2, wherein the surface layer portion constituting the emitter zone of the first transistor is deeper and more highly doped than the surface layer portion below the emitter zone of the second transistor.

4. A device as claimed in claim 3, wherein the thickness of the emitter zone of the second transistor is smaller than the thickness of said surface layer portion constituting the emitter zone of the first transistor.

5. A semiconductor device as claimed in claim 1, wherein a layer of the second conductivity type and having a higher doping than that of the first epitaxial layer is buried within at least that portion of the first epitaxial layer below the second transistor but not in that portion of said first epitaxial layer below the first transistor.

6. A semiconductor device as claimed in claim 5, wherein said more highly doped layer of the second conductivity type in the first epitaxial layer surrounds the base zone of the first transistor.

7. A semiconductor device as in claim 2, wherein the part of the emitter zone of the first transistor which comprises a part of the more highly doped surface layer portion of the second epitaxial layer adjoins the walls of said groove.

8. A semiconductor device as in claim 2, wherein the part of the emitter zone of the first transistor which is formed by a part of the more higly doped surface layer of the second epitaxial layer is spaced apart from the walls of said groove.

9. A semiconductor device as in claim 1, wherein a second groove is provided in that part of the second epitaxial layer which forms the emitter zone of the first transistor, which second groove cuts the second epitaxial layer entirely and cuts the first epitaxial layer only partially, and a dopant determining the second conductivity type is provided in the walls and bottom of the second groove so that the bottom of the second groove forms a contact zone on the base zone of the first transistor.

10. A semiconductor device as in claim 1, wherein said first and second transistors are connected to form a Darlington type amplifier in which the substrate is of n-type, the first epitaxial layer is of p-type, the second epitaxial layer is of n-type and contact layers are provided on the emitter zone of the first transistor, on the base zone and on the emitter zone of the second transistor, and on the substrate.

11. A semiconductor device as in claim 1, further comprising at least a third transistor having the same structure and of the same type as that of the first transistor, the base zones of the first and third transistors being insulated from each other by a groove the depth of which exceeds that of the combined thickness of the first and second epitaxial layers, the substrate constituting a collector zone which is common to the first and third transistors.

12. A semiconductor device as in claim 1, wherein the first and the second transistors comprise a first Darlington circuit, and further comprising a second Darlington circuit comprising two further transistors each having the same structure as the first transistor, the two Darlington circuits being interconnected to form a push-pull amplifier, a common base plate on which both Darlington circuits are mounted, and a common envelope housing the base plate and Darlington circuits.

* * * * *

UNITED STATES PATENT AND TRADEMARK OFFICE
CERTIFICATE OF CORRECTION

PATENT NO. : 4058825
DATED : November 15, 1977
INVENTOR(S) : MAURICE BONIS ET AL It is certified that error appears in the above-identified patent and that said Letters Patent are hereby corrected as shown below:

Column 3, line 61, "then" should read -- than --.

Column 10, line 47, "thickness" should read -- thicknesses --.

Signed and Sealed this

Twenty-third Day of May 1978

[SEAL]

Attest:

RUTH C. MASON
Attesting Officer

LUTRELLE F. PARKER
Acting Commissioner of Patents and Trademarks